United States Patent [19]

Skrypek et al.

[11] 4,048,917

[45] Sept. 20, 1977

[54] CONTINUOUS MOTION PRINTING APPARATUS

[75] Inventors: John P. Skrypek, Mahwah; Arnold Peters, West Paterson, both of N.J.

[73] Assignee: Sun Chemical Corporation, New York, N.Y.

[21] Appl. No.: 617,007

[22] Filed: Sept. 26, 1975

[51] Int. Cl.² .................... B41F 17/20; H01J 37/00

[52] U.S. Cl. .................... 101/40; 34/4; 118/642; 219/343; 219/354; 219/388; 240/47; 250/504

[58] Field of Search .................... 101/40, 38 R, 38 A, 101/39; 250/454, 455; 34/4; 432/230, 124; 118/322, 319, 641–643; 219/388 C, 405, 411, 343, 354

[56] References Cited

U.S. PATENT DOCUMENTS

| | | | |
|---|---|---|---|
| 1,485,925 | 3/1924 | Hogenson | 118/319 |
| 2,132,818 | 10/1938 | Cone | 101/40 X |
| 2,323,214 | 6/1943 | Gardner | 432/124 |
| 2,484,671 | 10/1949 | Bauman | 101/40 UX |
| 2,737,886 | 3/1956 | Ruppel | 101/40 X |
| 2,882,818 | 4/1959 | Vowles | 101/126 |
| 3,195,451 | 7/1965 | Hovekamp et al. | 101/38 R |
| 3,315,780 | 4/1967 | Karlyn | 101/40 UX |
| 3,745,307 | 7/1973 | Peek, Jr. et al. | 34/4 X |
| 3,766,851 | 10/1973 | Sirvet et al. | 101/40 |
| 3,894,237 | 7/1975 | Choate et al. | 250/454 X |
| 3,934,500 | 1/1976 | Jackson | 101/38 A |

FOREIGN PATENT DOCUMENTS

| | | | |
|---|---|---|---|
| 342,240 | 12/1959 | Switzerland | 101/38 R |

*Primary Examiner*—Clifford D. Crowder
*Attorney, Agent, or Firm*—Cynthia Berlow

[57] ABSTRACT

Apparatus for decorating cylindrical containers is provided with a curing section mounted directly thereto. The containers are held by mandrels while decorations are applied and are then removed by suction transfer spindles which carry the containers through the curing section. Each transfer spindle is connected to the output of an individual clutch that is actuated only while the spindle is at the curing section. The clutch input is rotated continuously so that when the clutch is energized the transfer spindle rotates and the container carried thereby rotates when at the curing section.

6 Claims, 11 Drawing Figures

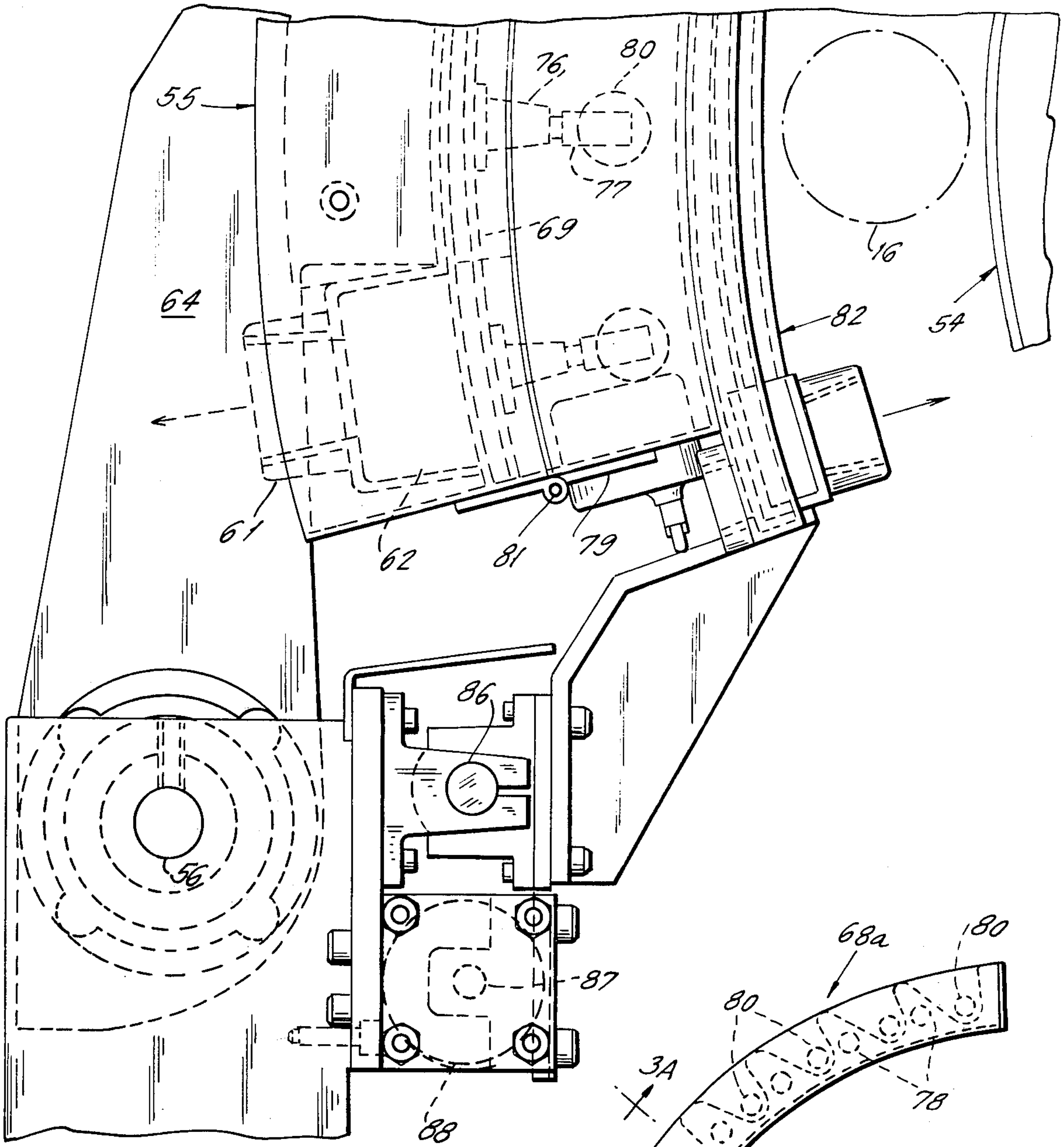
FIG. 2A.
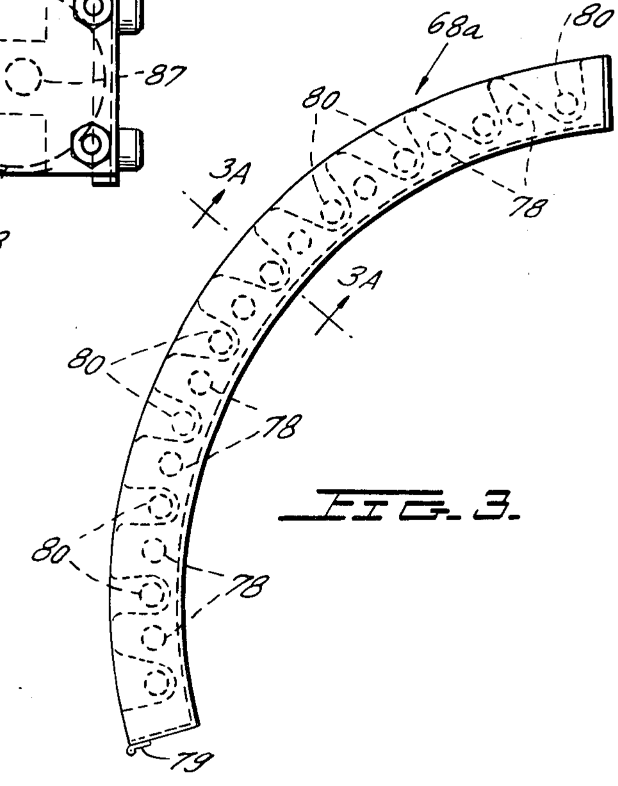
FIG. 3.
FIG. 3A.
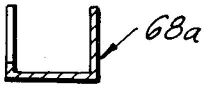

CONTINUOUS MOTION PRINTING APPARATUS

U.S. Pat. No. 3,766,851 issued Oct. 23, 1973, to E. Sirvet et al. for CONTINUOUS CAN PRINTER AND HANDLING APPARATUS describes a machine for loading containers on mandrels which hold the containers while decorations and a protective coating of varnish are applied thereto. Thereafter, the decorated containers are loaded onto suction elements of a transfer wheel and from there are deposited on a pin chain which carries the decorated containers through a curing oven. Traditionally, the curing oven is a large gas powered unit.

Because of the cost and environmental considerations, the desirability of utilizing solvent-free inks and ultraviolet curing has become more and more attractive. The straightforward approach is to replace the gas-fired curing ovens of the prior art by ovens having ultraviolet radiation sources therein. However, with this type of substitution, there remains curing ovens that are comparable in size with the large decorating apparatus. Further, means must be provided to load decorated cans onto the pin chain, and at the exit of the curing ovens means must be provided to strip cans from the pin chain.

In accordance with the instant invention, ultraviolet curing lamps are mounted directly to the decorator apparatus in operative position so that curing radiation impinges upon containers while they are held by the transfer wheel. After curing of the containers, they are deposited in an output chute conveyor directly from the transfer wheel.

In order to utilize the ultraviolet rays sufficiently, thereby making the curing section very compact, the containers are rotated as they are in the curing section. This rotation is achieved by providing an individual clutch for each of the transfer wheel spindles. The clutch is rotated continuously and is normally disengaged from the clutch output which is connected to the transfer spindle. The clutch is actuated so that the spindle rotates in the curing region. Since the spindle is a low inertia structure when the clutch is deactivated, rotation of the transfer spindle ceases very quickly so that when a container is being picked up by the transfer spindle the latter is not rotating.

The ultraviolet sources are elongated lamps positioned with their axes generally parallel to the axis of rotation for the transfer wheel. These lamps are arranged in an arcuate array outboard of the spindles and are part of a subassembly which also includes an arcuate main reflector. The subassembly is pivoted at its downstream end so as to be easily movable away from the spindles to a position in which the lamps may readily be removed and replaced. The reflector is a water-cooled unit constructed of a plurality of arcuate tubes having rectangular cross-sections and stacked side by side. The lamp holders are air-cooled and are disposed within housings along opposite sides of the main reflector. These housings are provided with openable covers to facilitate lamp removal. A liquid-cooled arcuate shutter is mounted for movement generally parallel to the axis of the transfer wheel. When the transfer wheel stops rotating or when it is being rotated without carrying containers, the shutter is moved to a radiation blocking position wherein the shutter is interposed between the ultraviolet lamps and the spindles. A liquid-cooled shield is disposed inboard of the spindles so that radiation that does not impinge upon the containers will not overheat the transfer wheel or its spindle elements.

Accordingly, a primary object of the instant invention is to provide a novel arrangement for curing of container decorations.

Another object is to provide an arrangement of this type in which there is a curing section mounted directly to container decorating apparatus.

Still another object is to provide an arrangement of this type in which containers are subjected to radiation curing while they are being held by transfer elements that remove the containers from mandrels that hold these containers during decoration thereof.

A further object is to provide an arrangement of this type in which means are provided whereby spindles on a continuously rotating transfer wheel do not rotate with respect to the spindle axes while the spindles pick up decorated containers but rotate with respect to the spindle axes when these containers move through a curing section.

A still further object is to provide an arrangement of this type in which there is an individual clutch associated with each spindle on a transfer wheel, with the clutch input being rotated continuously and being selectively engageable with the clutch output connected to rotate the spindle.

These objects as well as other objects of this invention shall become readily apparent after reading the following description of the accompanying drawings in which:

FIG. 2A is an enlarged fragmentary portion of FIG. 2 in the region of the pivot for the main reflector and the lamp assembly.

FIG. 3 is a side elevation showing details of the cover for one of the enclosures that house the lamp terminals.

FIG. 3A is a cross-section taken through lines 3A—3A of FIG. 3 looking in the direction of arrows 3A—3A.

Figure 6:
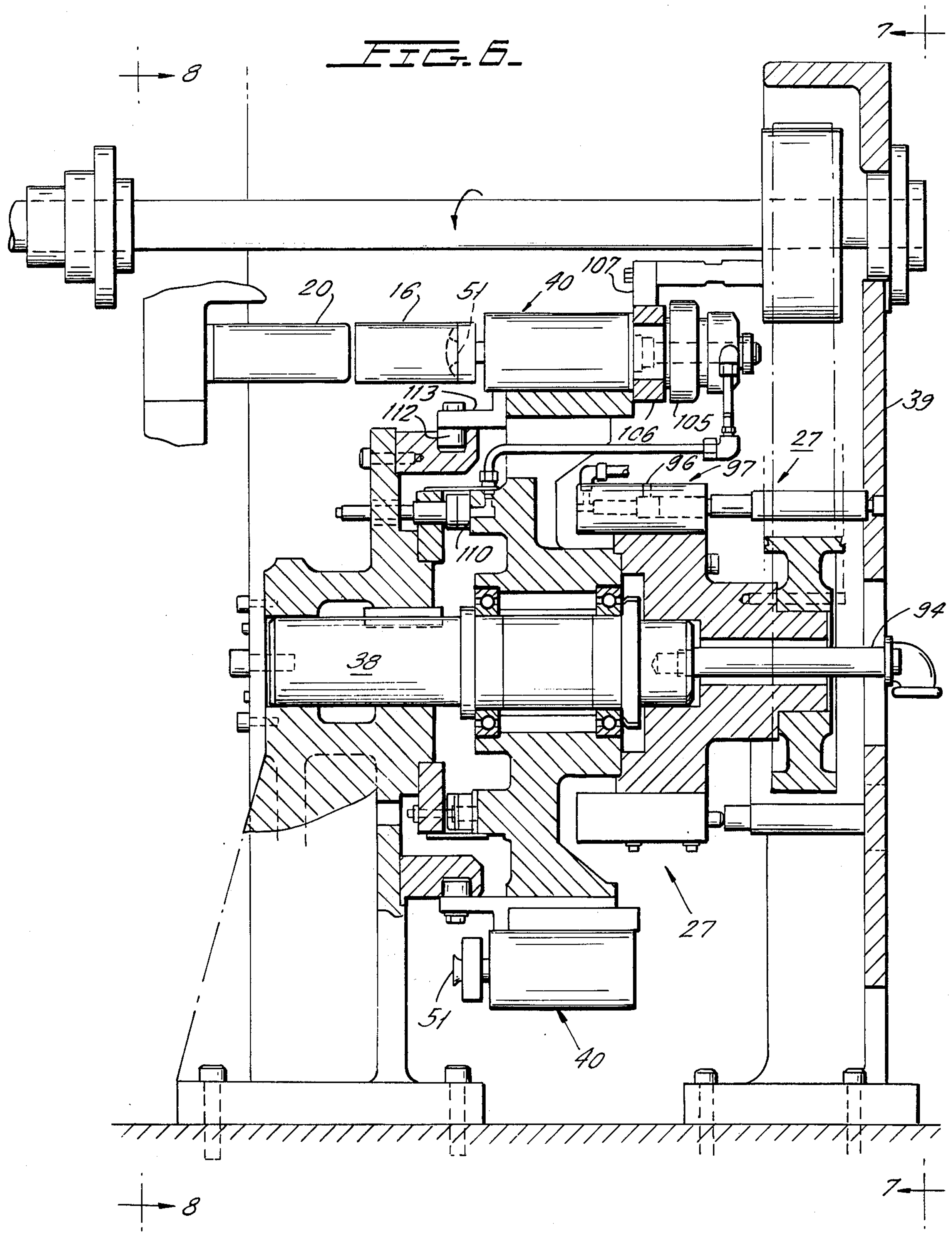
FIG. 6 is a vertical cross-section of the transfer wheel taken through line 6—6 of FIG. 1, looking in the direction of arrows 6—6.
Figure 7:
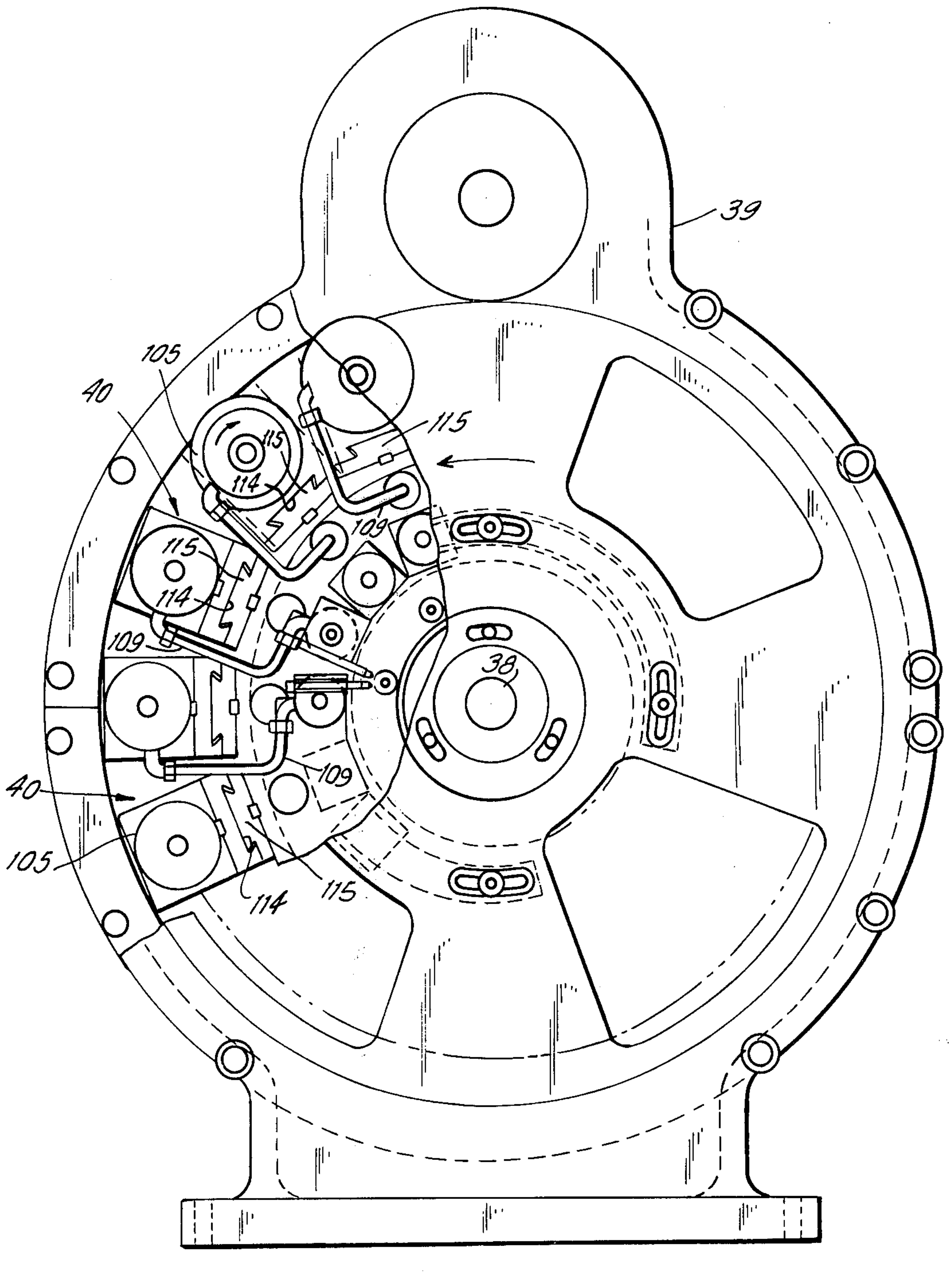
Figure 8:
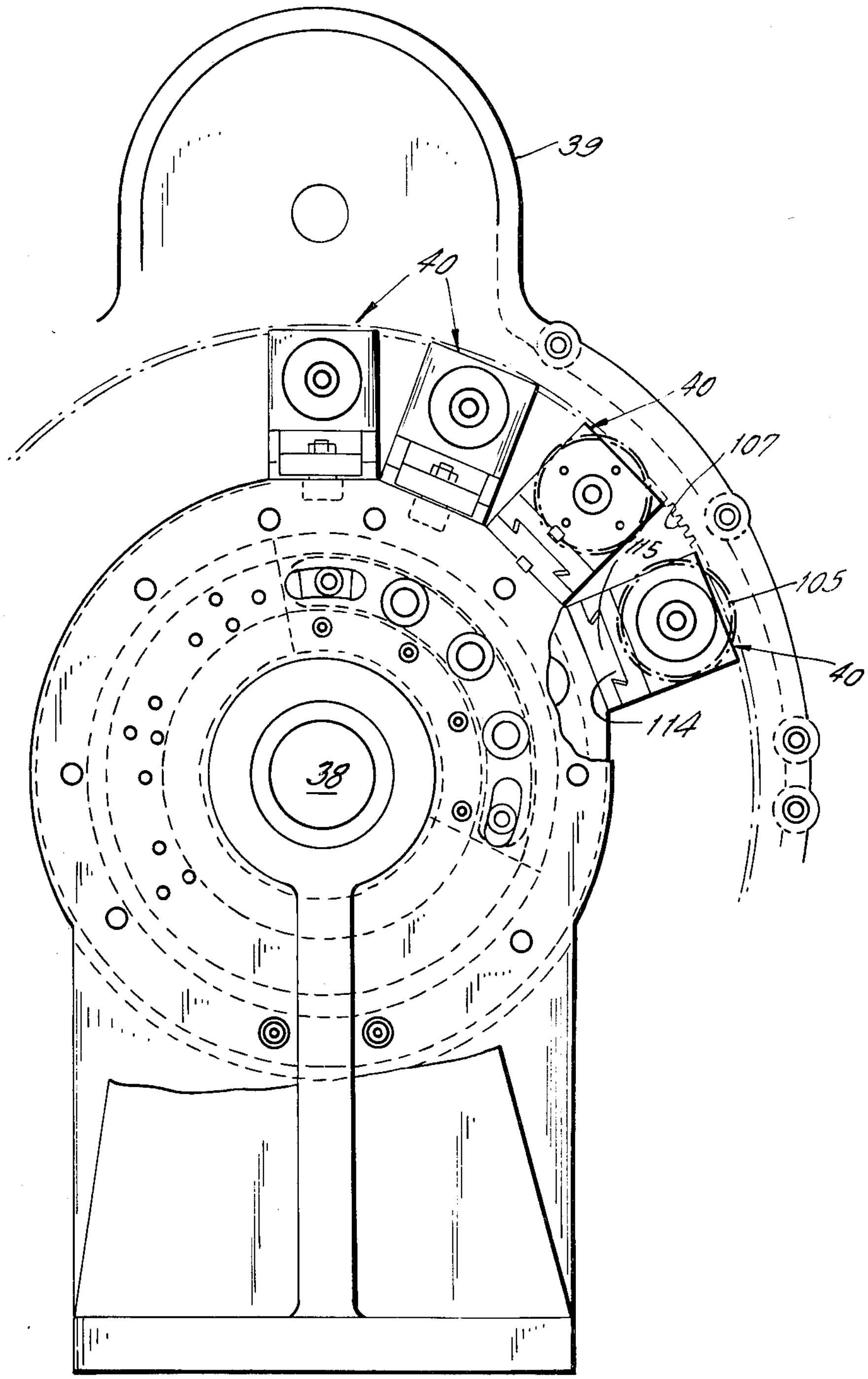

FIGS. 7 and 8 are partially sectional elevations of the transfer wheel looking in the directions of the respective arrows 7—7 and 8—8 of FIG. 6.

Figure 1:
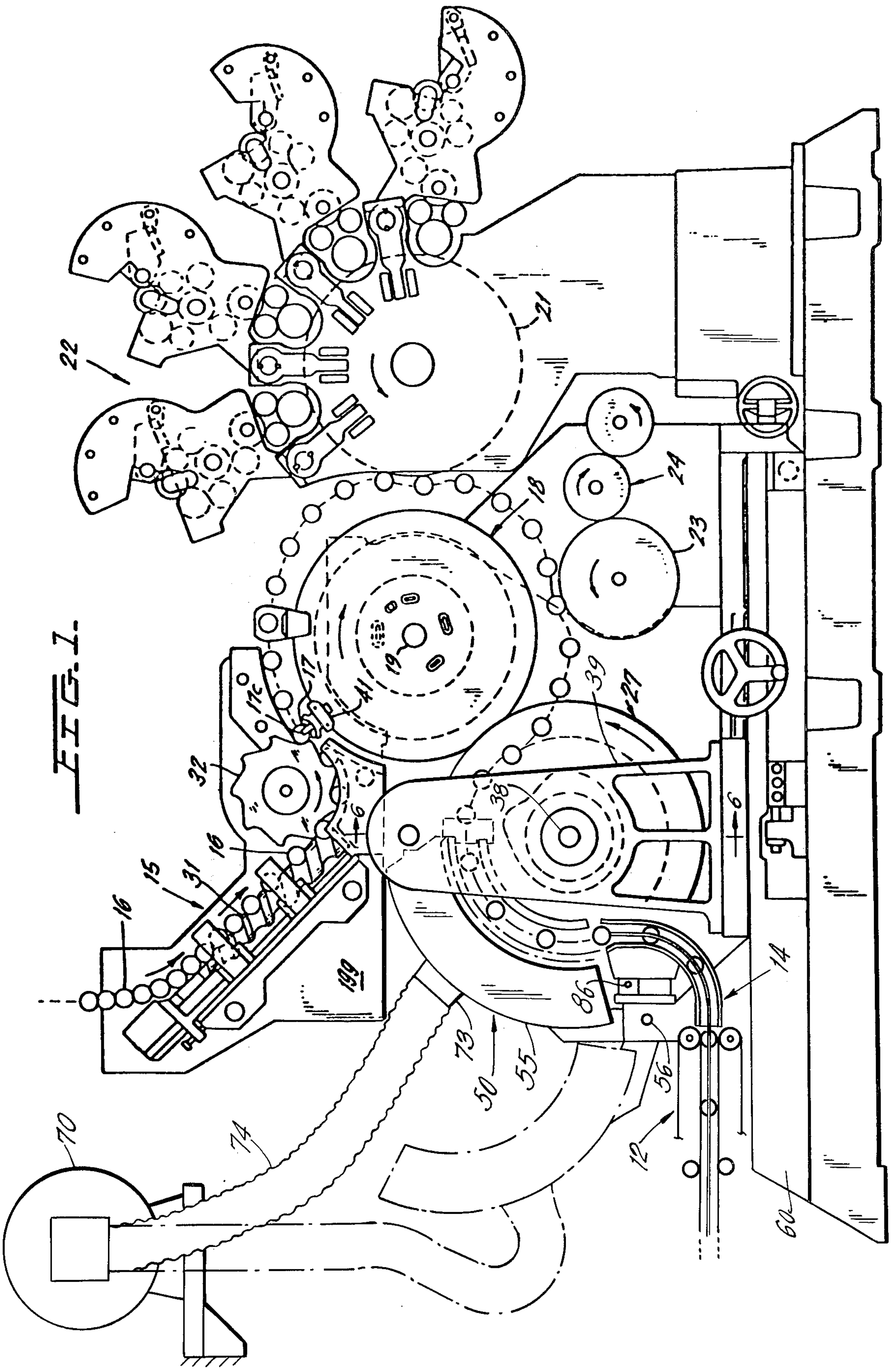
FIG. 1 is a side elevation in schematic form of continuous motion container decorating apparatus including a curing section constructed in accordance with teachings of the instant invention.

Now referring to the figures. FIG. 1 illustrates apparatus which receives undecorated seamless cylindrical containers 16 at infeed device 15 and delivers these containers at gravity feed output conveyor, in the form of chute 14, discharging into double belt driven conveyor 12. After decorations have been applied to these containers at decorating section 22, a coat of varnish has been applied to these containers at overvarnish unit 24, and the decorations have been cured at ultraviolet lamp curing section 50. As explained in detail in the aforesiad U.S. Pat. No. 3,766,851, at infeed device 15 cylindrical containers 16, open at one end, are spaced by lead screw 31 and delivered by star wheel 32 to pockets or cradles 17 along the periphery of a wheel of assembly 18 that rotates continuously on axis 19. Cradles 17 also move axially to deposit containers 16 on freely rotatable mandrels 20 (FIG. 6) mounted on another wheel of assembly 18.

Figure 6A:
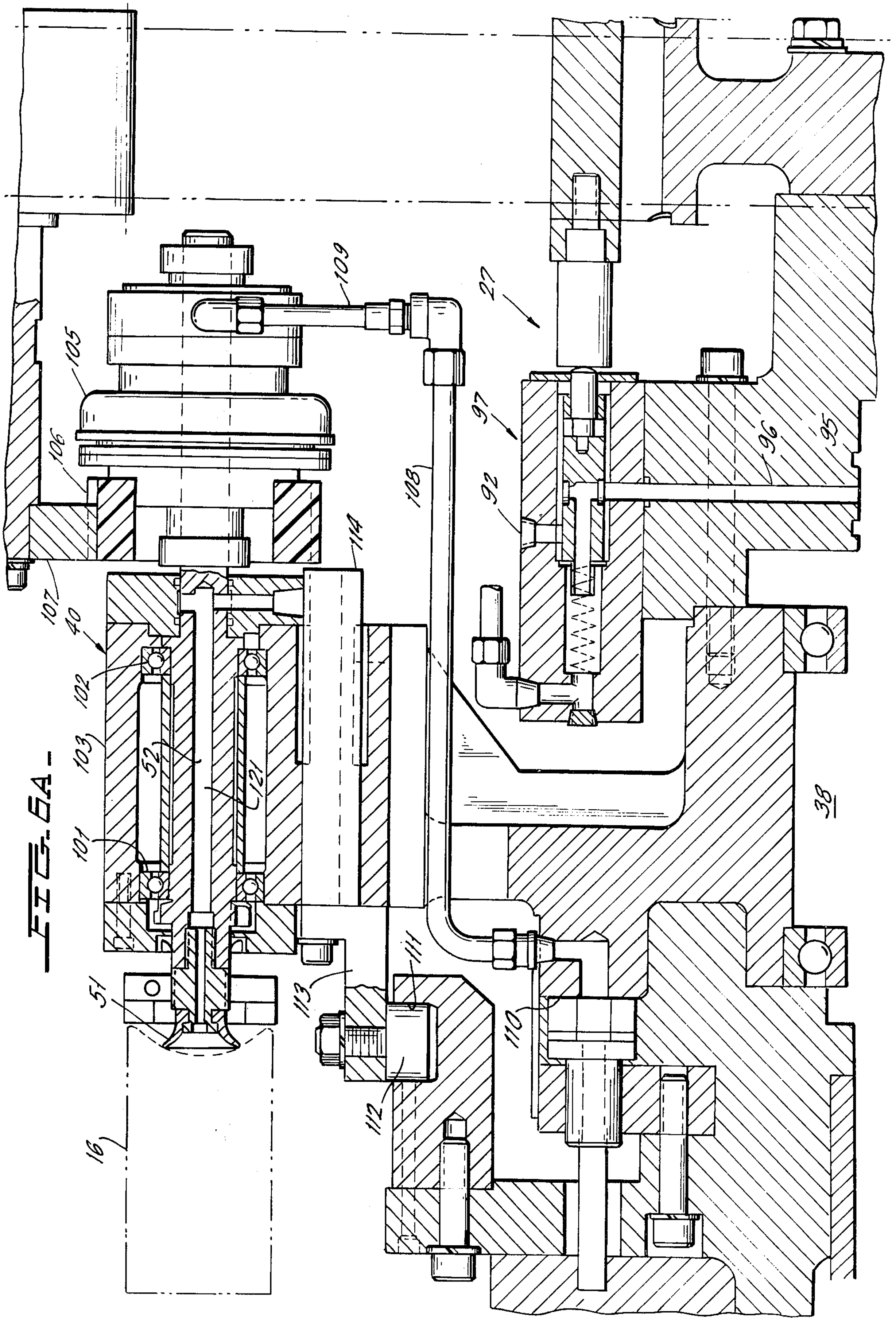
FIG. 6A is an enlarged fragmentary portion of FIG. 6.

Containers 16 mounted on mandrels 20 have decorations applied thereto by being brought into engagement with the periphery of blanket wheel 21 in decorating section 22. The decorated containers are then brought into engagement with the periphery of applicator wheel 23 in overvarnish unit 24 whereby a protective coating of varnish is applied over the decorations. Decorated cans 16 are then stripped from mandrels 20 by transfer heads 40 of transfer assembly 27. The latter is mounted on frame post 39 for rotation about axis 38. Decorated containers are operatively held at transfer assembly 27 by suction applied to cups 51 at the free ends of spindles 52 (FIG. 6A). After containers 16 are carried through curing section 50, suction at cups 51 is deactivated when the containers 16 are aligned with the upper or entrance end of gravity chute 14 into a driven conveyor 12. For reasons that shall become obvious, while containers 16 pass through curing section 50 spindles 52 are rotated to rotate containers 16.

As seen best in FIGS. 2 through 5, curing section 50 includes stationary arcuate reflector-shielf 54 interposed between the feed path for containers 16 and transfer assembly axis 38. Reflector 54 is a hollow unit through which cooling liquid is circulated, with this liquid being introduced at inlet port 49 and exiting at outlet port 48. Curing section 50 also includes subassembly 55 mounted to stationary pivot 56 so as to be pivotable approximately 60° from the working or solid-line position of FIG. 1 to the servicing or phantom position, for a reason which shall hereinafter be seen.

Subassembly 55 includes arcuate main reflector 57 constructed of seven arcuate tubes of rectangular cross-section assembled in abutting side-by-side relationship. The upper ends of these tubes are connected to transverse manifold 58 into which cooling liquid is introduced through fitting 59. This cooling fluid exists through fitting 61 connected to transverse manifold 62 to which the lower ends of the tubes constituting reflector 57 are connected.

Plates 63, 64 connected to reflector 57 along opposite edges thereof mount subassembly 55 is pivot rod 56. The latter also extends through spaced uprights 65, 66 fixedly secured to the same base 60 to which are secured infeed device 50, wheel assembly 18, decorating section 22, overvarnish unit 24, and transfer assembly 27. Disposed along opposite side edges of reflector 57 are arcuate housings 67, 68. Each of these housings is provided with an internal arcuate partition 69 serving to divide the housing into chambers 71, 72. Chambers 71 are connected by outlet fittings 73 and flexible conduits 74 to the inlet of centrifugal blower 70, so that air is drawn into chambers 71 through apertures in partitions 69 and apertures 78 (FIGS. 74A and 3) in the sidewalls of covers 67*a*, 68*a* for chambers 72 of the respective housings 67, 68.

Disposed within each of the chambers 72 are a plurality of insulator standoffs 76 secured to partitions 69 and extending radially inward. Mounted to the free end of each insulator 76 is a clamp-type terminal or lamp holder 77 which engages a terminal of an ultraviolet lamp 80. Cover 68*a* is provided at its lower end with hinge member 79 that mounts cover 68*a* on pivot pin 81, thereby pivotally mounting cover 68*a*. The upper end of cover 68*a* is engaged by a releasable catch means (not shown) to hold cover 68*a* in the closed position shown in FIG. 2. Cover 68*a* is a U-shaped cross-section with the inner wall thereof having notches which extend to the free edge of the inner wall and provide clearances through which lamps 80 extend when cover 68*a* is closed. Cover 67*a* is essentially a mirror image of cover 68*a*.

Figure 2:
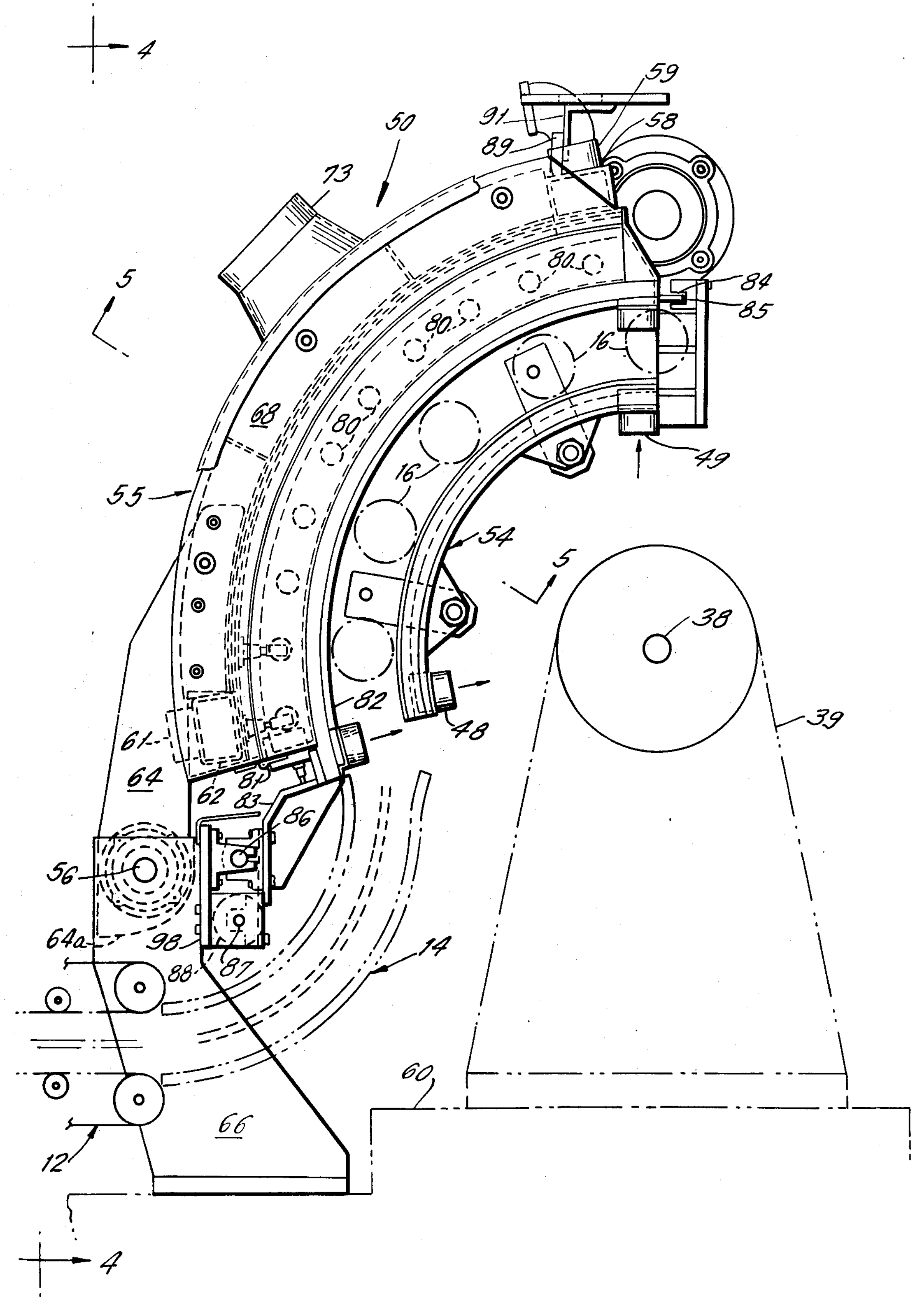
FIG. 2 is an enlarged side elevation of the main elements constituting the curing section.
Figure 4:
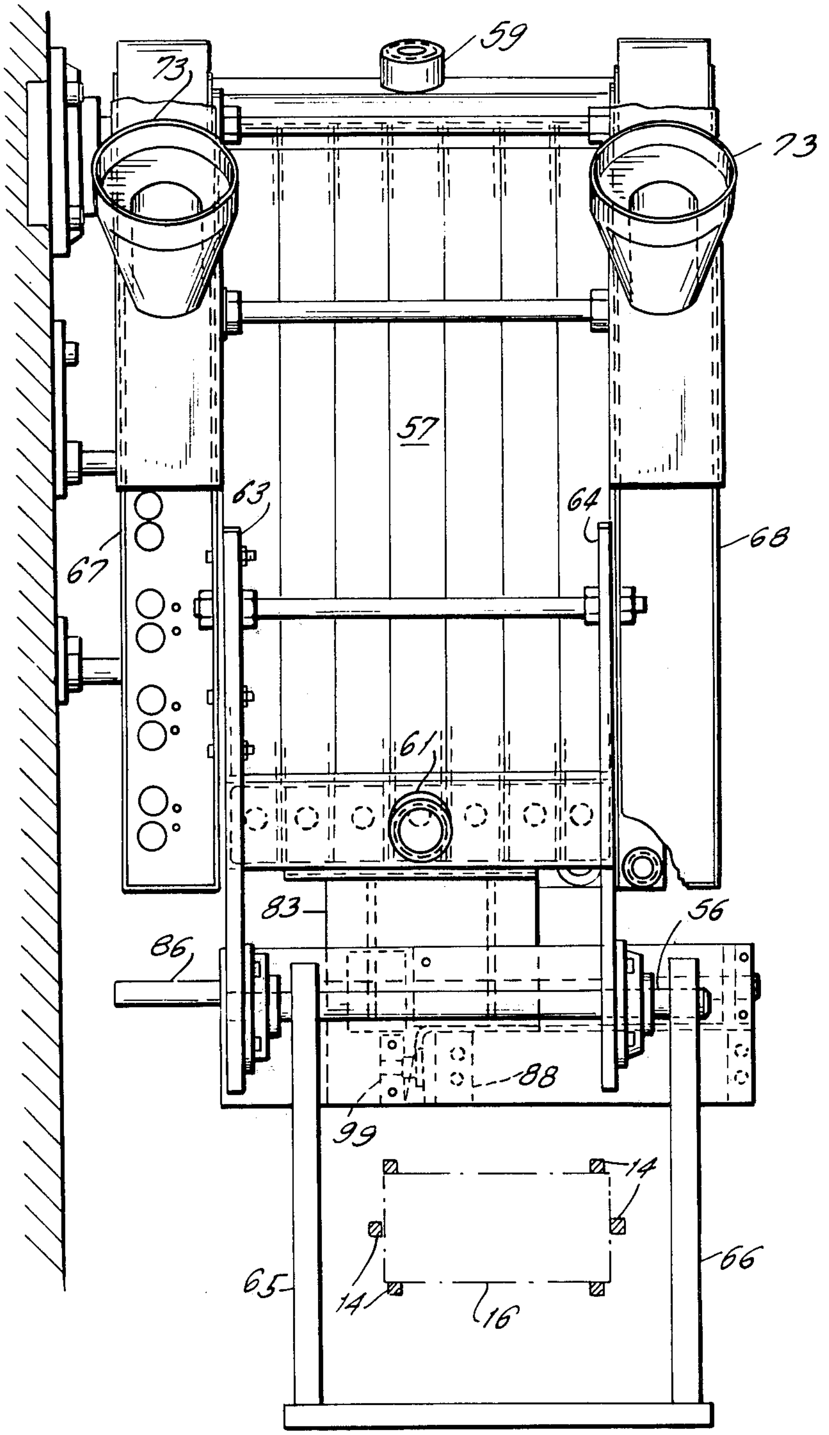
FIG. 4 is a rear elevation of the curing section looking in the direction of arrows 4—4 of FIG. 2.
Figure 5:
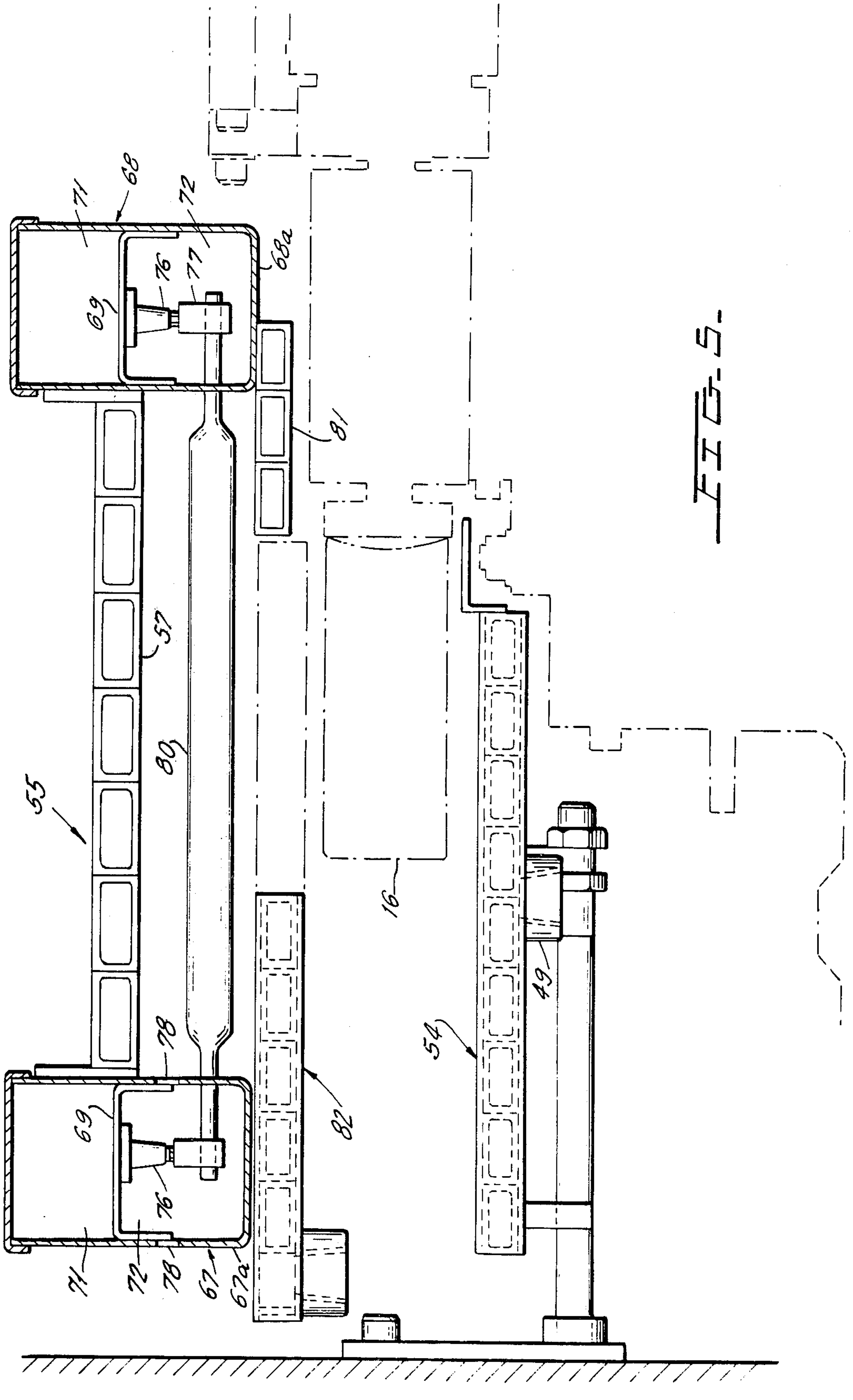
FIG. 5 is a cross-section taken through line 5—5 of FIG. 2 looking in the direction of arrows 5—5.

Ultraviolet lamps 80 are elongated members having their longitudinal axes extending parallel to rotational center 38 for transfer assembly 27. As seen in FIG. 2, lamps 80 are disposed in an arcuate array along a line essentially parallel to the reflecting surfaces of the main reflector 57 and stationary reflector 54. There are ten evenly spaced lamps 80 in the array illustrated with the centers of the end lamps being positioned at the 8° and 98° positions counterclockwise of the vertical centerline through axis 38. Thus, as containers 16 move through the space between reflectors 54 and 57, ultraviolet radiation emitted by lamps 80 impinges upon containers 16 for the curing of decorations thereon, whether these decorations be in the form of a multicolor presentation or a single color coating.

Curing section 50 further includes stationary liquid-cooled shield 81 (FIG. 5) and axially movable liquid-cooled shutter 82 aligned with shield 81. Shutter 82 is secured at its lower end to bracket 83 and at its upper end is provided with tongue 84 that rides in stationary guide channel 85. The end of bracket 83 remote from shutter 82 is slidably mounted to guide rod 86 that extends parallel to reflector assembly pivot 56. In addition, bracket 83 is connected through block 99 to output shaft 87 of power cylinder 88, so that actuation of the latter is effective to remote shutter 82 from its inactive or solid-line position of FIG. 5 to its active position adjacent the left end of shield 81. Shutter 82 is operated to its active position when rotation of transfer assembly 27 is stopped. In its active position, shutter 82 is interposed between container 16 and the array of lamps 80 so that radiation from the latter does not impinge upon containers 16. This prevents overheating of container 50 and the decorations thereon as a result of overexposure to radiation from lamps 80. Shutter 82 is provided in that it is impractical to deenergize lamps 80 for short periods of time.

Engagement of ear 89 at the upper end of reflector assembly 50 with stationary bracket 91 establishes the operating position for subassembly 55. When it becomes necessary to change one of the lamps 80 or to otherwise service subassembly 55, the latter is pivoted counterclockwise with respect to FIG. 2 about rod 56 as a center until edge portion 64*a* (FIG. 2) of plate 64*a* engages stop surface 98 at which time subassembly 55 is in its servicing position. Now there is sufficient clearance to open covers 67*a*, 68*a* by pivoting them clockwise about their respective hinge pins 81.

Now referring more particularly to FIGS. 6 through 8. Transfer assembly 27 includes a circular array of transfer heads 40, each including a spindle 52 rotatably mounted on bearings 101, 102 in head frame 103. The end of spindle 52 remote from suction cup 51 is connected to the output of pneumatically actuated clutch 105 whose input is keyed to pinion gear 106. The latter is in operative engagement with the internal teeth of stationary ring gear 107, so that rotation of transfer assembly 27 causes rotation of pinion 106. Clutch 105 is actuated to drivingly connect its input to its output by the introduction of air under pressure through conduits 108, 109, with the latter being flexible. With clutch 105 actuated, rotation of pinion 106 causes rotation of spindle 52 about its longitudinal axis, for a reason to be hereinafter explained. The angular positions of transfer assembly 27 during which each of the respective transfer heads 40 is energized is from the vertical centerline through axis 38 to a position approximately 104° counterclockwise thereof, and is controlled at valve interface 110 (FIG. 6).

Head 40 is also axially movable with this movement being controlled by cam groove 111 and follower 112 connected to bracket 113. The latter is connected to head frame 103 which is provided with undercut axially extending notch 114 (FIG. 8) that receives cooperating axially extending guide formation 115. It is noted that pinion 106 is considerably wider than spur gear 107 so that these two elements remain in operative engagement regardless of the angular position of transfer assembly 27.

Spindle 52 is provided with longitudinal bore 121 which communicates with the interior of suction cup 51. Bore 121 is selectively connected to atmosphere and to a source of low pressure air by means of cam operated valve 97 so that at predetermined angular positions of head assembly 40 container holding suction power will appear at suction cup 51. The atmosphere connection of valve 97 is at part 92 and vacuum is connected through passages 94 and 96 connected at interface 95 (FIGS. 6 and 6A).

Suction cup 51 is moved to the left with respect to FIG. 6A in order to unload containers 16 from mandrels 20 in a manner described in the aforesaid U.S. Pat. No. 3,766,851. During this loading of containers 16 onto assembly 27, clutch 105 is deactivated and spindle 52 does not rotate with respect to its longitudinal axis. During the interval when head 40 is in the angular position of transfer assembly 27 embraced by curing section 50, clutch 105 is actuated so that spindle 52 rotates about its longitudinal axis. During the curing interval when container 16 is subjected to radiation from lamps 80, container 16 revolves approximately slightly more than two revolutions. As head 40 moves past the lower end of the array of lamps 80, clutch 105 is deenergized (approximately 14° counterclockwise of the vertical centerline) and approximately 8° thereafter, when container 16 is aligned with the entrance to chute 14, the vacuum at suction cup 51 is released so that container 16 falls into chute 14. The inertia of spindle 52 and the elements keyed thereto is so low that spindle 52 stops rotating about its longitudinal axis during a very short angular movement of transfer assembly 27. When spindle 52 is being unloaded, it is rotating only very slowly and may even have stopped rotating. When spindle 52 is to be reloaded with another container 16, spindle 52 is no longer rotating about its longitudinal axis.

Thus, it is seen that the instant invention provides a novel compact construction for radiation-curing apparatus integrated with apparatus for decorating cylindrical containers. Even though the curing apparatus is secured directly to the decorating apparatus, the former is constructed so that there is ready access to the lamp elements for changing thereof.

While the instant invention has been described in connection with utilization of ultraviolet radiation for curing, it should now be apparent to those skilled in the art that the curing section may have many different forms of curing means including means for producing flames that impinge directly upon containers moving through the curing section or come very close to the exterior surfaces thereof.

Although there have been described preferred embodiments of this novel invention, many variations and modifications will now be apparent to those skilled in the art. Therefore, this invention is to be limited not by the specific disclosure herein but only by the appending claims.

The embodiment of the invention in which an exclusive privilege or property is claimed are defined as follows:

1. Apparatus for decorating and curing generally cylindrical articles including continuous motion conveyor means having an input which receives undecorated articles and an output from which decorated articles are discharged, decorator means for applying decorations to undecorated articles on said conveyor means, and curing means for curing decorations applied to articles by said decorator means; said conveyor means including a plurality of rotatably mounted mandrels in continuous motion transverse to their rotational axes, said mandrels carrying articles while said decorator means applies decorations thereto; said conveyor means also including a transfer assembly including a continuously rotating wheel mounting a plurality of heads which receive decorated articles directly from said mandrels and hold these articles while decorations thereon are being cured by said curing means, each of said heads including a spindle having an axis substantially coincident with the axis of an article carried thereby; and means for rotating both said spindle and an article thereon about their axes while an article on the spindle is having its decorations cured by said curing means, said means for rotating said spindle and an article thereon being inactive to rotate said spindle while an article is being received by said spindle from said mandrel.

2. Apparatus as set forth in claim 1 in which the means for rotating said spindle includes a clutch having an output portion connected to said spindle and an input portion disengaged from said output portion when said clutch is deactuated and in driving engagement with said output portion when said clutch is actuated, said transfer assembly also including means for continuously rotating said input portion.

3. Apparatus as set forth in claim 2 in which the input portion includes a gear element drivingly engaged with a stationary gear element constituting said means for continuously rotating said input portion.

4. Apparatus as set forth in claim 1 in which said wheel is mounted for continuous rotation about a main axis and the plurality of heads are arranged in an array along the edge of the wheel, each of said spindles disposed generally parallel to said main axis.

5. Apparatus as set forth in claim 4 is which the curing means is disposed in the vicinity of the output of said transfer assembly.

6. Apparatus as set forth in claim 5 in which the means for rotating said spindle includes a clutch having an output portion connected to said spindle and an input portion disengaged from said output portion when said clutch is deactuated and in driving engagement with said output portion when said clutch is actuated, said transfer assembly also including means for continuously rotating said input portion, said input portion including a gear element drivingly engaged with a stationary gear element constituting said means for continuously rotating said input portion.

* * * * *